United States Patent
Law et al.

(10) Patent No.: US 10,485,111 B2
(45) Date of Patent: Nov. 19, 2019

(54) VIA AND SKIP VIA STRUCTURES

(71) Applicant: GLOBALFOUNDRIES INC., Grand Cayman (KY)

(72) Inventors: Shao Beng Law, Watervliet, NY (US); Nicholas V. LiCausi, Watervliet, NY (US); Errol Todd Ryan, Clifton Park, NY (US); James McMahon, Clifton Park, NY (US); Ryan S. Smith, Clifton Park, NY (US); Xunyuan Zhang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 15 days.

(21) Appl. No.: 15/647,400

(22) Filed: Jul. 12, 2017

(65) Prior Publication Data
US 2019/0021176 A1 Jan. 17, 2019

(51) Int. Cl.
H05K 3/46 (2006.01)
H05K 3/40 (2006.01)
H05K 1/11 (2006.01)
H01L 21/768 (2006.01)

(52) U.S. Cl.
CPC ......... H05K 3/4644 (2013.01); H01L 21/768 (2013.01); H05K 1/115 (2013.01); H05K 3/4038 (2013.01); H05K 3/4069 (2013.01); H05K 2201/0347 (2013.01); H05K 2201/096 (2013.01); H05K 2201/09454 (2013.01); H05K 2201/09518 (2013.01); Y10T 29/49165 (2015.01)

(58) Field of Classification Search
CPC .. H05K 3/4644; H05K 3/4038; H05K 3/4069; H05K 2201/0347; H05K 2201/09454; H05K 2201/09518; H05K 2201/096; H05K 1/115
USPC .................. 29/852, 846, 829, 825, 592.1
See application file for complete search history.

(56) References Cited

U.S. PATENT DOCUMENTS

| 4,840,923 | A | 6/1989 | Flagello et al. |
| 6,430,058 | B1 | 8/2002 | Sankman et al. |
| 10,026,687 | B1* | 7/2018 | Lin ................. H01L 23/5226 |
| 2005/0041405 | A1* | 2/2005 | Kawagoe .......... H05K 1/115 |
| | | | 361/783 |

(Continued)

Primary Examiner — Peter Dungba Vo
Assistant Examiner — Azm A Parvez
(74) Attorney, Agent, or Firm — Anthony Canale; Andrew M. Calderon; Roberts Mlotkowski Safran Cole & Calderon, P.C.

(57) ABSTRACT

The present disclosure generally relates to semiconductor structures and, more particularly, to via and skip via structures and methods of manufacture. The method includes: forming a first metallization layer with a first capping layer over the first metallization layer; forming a second metallization layer with a second capping layer over the second metallization layer; forming a partial skip via structure to the first metallization layer by removing a portion of the first capping layer and the second capping and depositing conductive material in an opening formed in the second metallization layer; forming a third capping layer over the filled partial skip via and the second capping layer; and forming a remaining portion of a skip via structure in alignment with the partial skip via structure by opening the third capping layer to expose the conductive material of the partial skip via.

16 Claims, 3 Drawing Sheets

(56) References Cited

U.S. PATENT DOCUMENTS

2009/0236143 A1    9/2009  Nakamura
2016/0307793 A1*  10/2016  Huang .............. H01L 21/76879
2017/0103944 A1*  4/2017  Fukui ................... H05K 3/4038
2017/0178955 A1*  6/2017  Jiang ................ H01L 21/31144

* cited by examiner

VIA AND SKIP VIA STRUCTURES

FIELD OF THE INVENTION

The present disclosure generally relates to semiconductor structures and, more particularly, to via and skip via structures and methods of manufacture.

BACKGROUND

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a skip via can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

There are many challenges to using skip vias. For example, in the manufacturing process, e.g., the skip via etching process, the portion of the skip via structure above an upper metallization layer cap can become blown out while trying to open the cap. This damage results in yield loss through shorting to neighboring lines, and also results in a poor skip via profile, making metal fill difficult. These undesirable results decrease device performance. Further, even if the profile of the skip via structure is good, performing a metal fill with conventional physical vapor deposition (PVD) liner seed/copper (Cu) plate approach on a high aspect ratio via is challenging. Further still, having adequate gap fills for minimum insulator spacing is also a concern.

SUMMARY

In an aspect of the disclosure, a method comprises: forming a first metallization layer with a first capping layer over the first metallization layer; forming a second metallization layer with a second capping layer over the second metallization layer; forming a partial skip via structure to the first metallization layer by removing a portion of the first capping layer and the second capping and depositing conductive material in an opening formed in the second metallization layer; forming a third capping layer over the filled partial skip via and the second capping layer; and forming a remaining portion of a skip via structure in alignment with the partial skip via structure by opening the third capping layer to expose the conductive material of the partial skip via.

In an aspect of the disclosure, a method comprises: forming a via structure through an insulator between capping layers in a stack of metallization features; depositing a capping material over the via structure to form a thicker capping layer out of the capping layers; etching the thicker capping layer to expose the via structure; and forming a skip via structure from the via structure.

In an aspect of the disclosure, a structure comprises: a first metallization layer with a first capping layer over the first metallization layer; a second metallization layer with a second capping layer thicker with respect to the first capping layer and over the second metallization layer; a first via structure extending from the first metallization layer to the second metallization layer; and a second via structure extending from the first via structure and filled with a material different from the first via structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to via and skip via structures and methods of manufacture. In embodiments, the processes provided herein use an additional capping layer over an existing capping layer in order to provide an improved profile for a skip via structure. By using the additional capping layer, the processes and structures provided herein ensure that the skip via structure is fully aligned. The addition of this extra capping (masking) layer also allows for a minimum pitch skip via structure having a good profile control and a good fill to be manufactured. Additionally, the structures and processes described herein provide a good gap fill, alleviating minimum insulator concerns.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
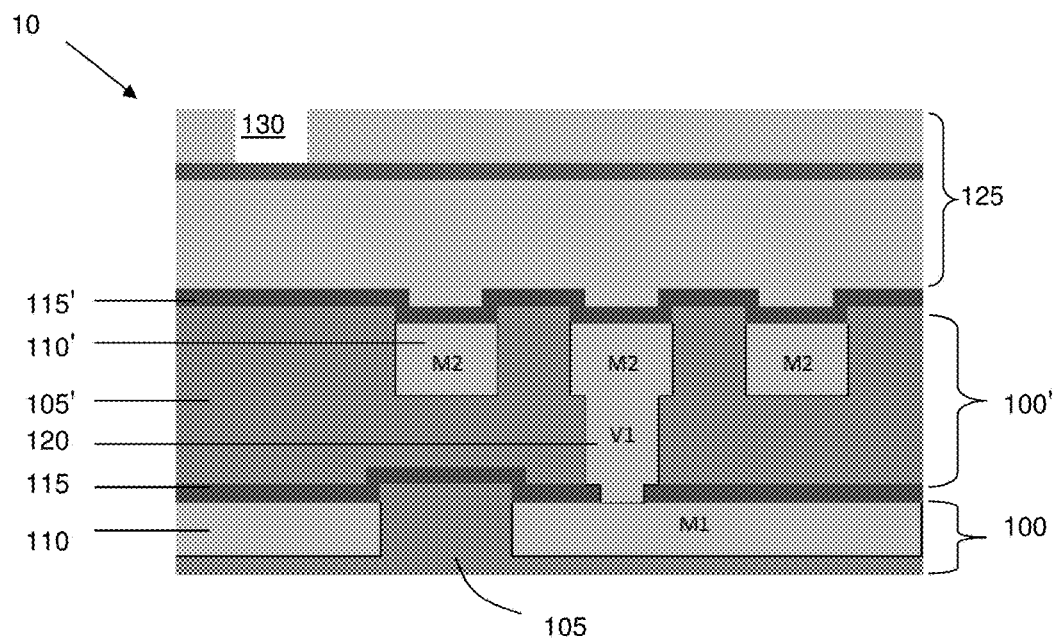
FIG. 1 shows an incoming structure, amongst other features, and respective fabrication processes in accordance with aspects of the present disclosure.

FIG. 1 shows an incoming structure and respective fabrication processes in accordance with aspects of the present disclosure. More specifically, FIG. 1 illustrates an initial structure 10 following metallization and CMP processes. The structure 10 includes first and second metallization layers 100, 100' comprising metallization features, M1, M2 and V1 in interlevel dielectric (ILD) layers 105, 105'. The ILD layers 105, 105' are formed from a low-k dielectric material, e.g., a dense oxide material or silicon nitride (SiN), amongst other materials. In embodiments, the metallization features M1, M2 and VI are wiring structures and vias as should be understood by those of skill in the art. In embodiments, for example, the ILD layer 105 includes a bottommost metal layer M1 comprising wiring structures; whereas the ILD layer 105' includes an upper metal layer M2 and the via structure V1 connecting to the metal layer M1, to form a stacked structure.

The metal layers M1, M2 and via V1 can be formed by conventional lithography and etching techniques, such as by a dual damascene process. The formation of metal layers M1, M2 can include deposition of a metal or metal alloy materials 110, 110', e.g., copper (Cu), amongst other examples. The via structure V1 can be formed by the deposition of a metal or metal alloy fill materials 120, e.g., Cu, tungsten (W) or aluminum (Al), amongst other conductive materials. In embodiments, the materials 110, 110', 120 can be deposited using conventional deposition processes, e.g., physical vapor deposition (PVD) or chemical vapor deposition (CVD) processes. Any residual material on a surface of the ILD layers 105, 105' after the deposition of fill metal can be removed by chemical mechanical polishing (CMP) processes.

As further shown in FIG. 1, the ILD layers 105, 105' are separated by a capping layer 115. Further, the metal layer M2 is partially recessed, i.e., the metal material 110' is partially recessed by an etching process, such as a wet etching process which uses chemistries to remove the Cu material, for example. A capping layer 115' is formed over the ILD layer 105' to facilitate a formation of a subsequent fully aligned via structure. As one with skill in the art would understand, the capping layers 115, 115' can be deposited by conventional deposition processes, e.g., PVD or CVD. The capping layers 115, 115' can be SiN, SiCN, SiNO or SiC material, amongst other materials. A lithographic stack 125 with an opening 130 is used for a subsequent etching of a partial skip via structure into the ILD layer 105', landing on the metal layer M1, e.g., metal material 110.

Figure 2:
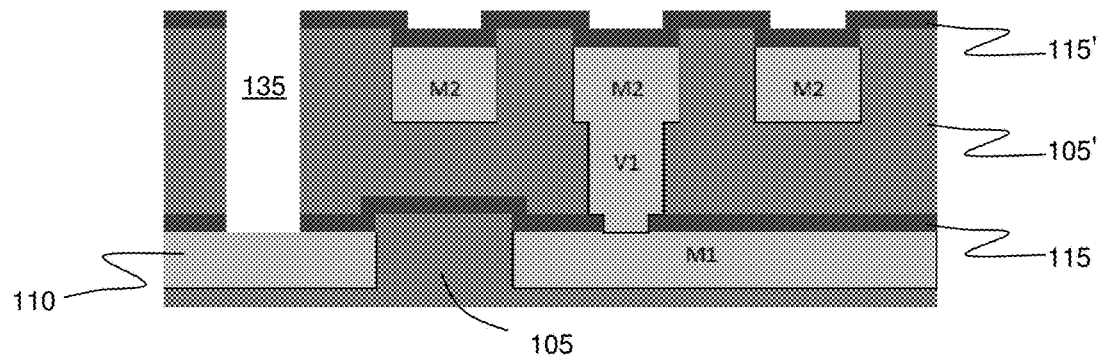
FIG. 2 shows a skip via structure extending to a metallization layer, amongst other features, and respective fabrication processes in accordance with aspects of the present disclosure.

FIG. 2 shows a partial skip via structure 135 formed through the capping layer 115' within the ILD layer 105' and landing on an exposed metal material 110 of the metal layer M1. For example, in embodiments the (partial skip) via structure 135 is etched using the lithographic stack 125 and a dry etching process, such as a RIE etching process. In a further etching of the via structure 135, the capping layer 115 is opened to expose the metal layer M1, exposing the underlying metal material 110, i.e., Cu.

Figure 3:
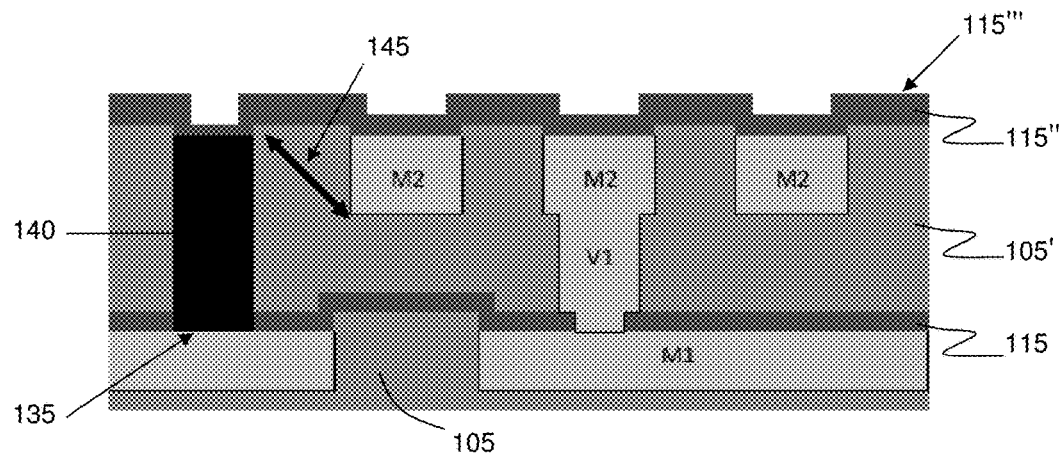
FIG. 3 shows a fill material within the skip via structure, amongst other features, and respective fabrication processes in accordance with aspects of the present disclosure.

FIG. 3 shows the via structure 135 filled with a fill material 140. The fill material 140 can be cobalt (Co) or ruthenium (Ru), amongst other fill materials. The fill material 140 can be deposited within the via structure 135 by a CVD process or, an electroless Co growth. In embodiments, the deposition time of the fill material 140 can be controlled, filling up about 80% to 90% of the via structure 135. In embodiments, the fill material 140 can be deposited or grown to a height about equal to the metal layer M2. More particularly, the fill material 140 should not overflow the via structure 135.

Still referring to FIG. 3, a thin capping (mask) material 115" is conformally deposited over the existing capping layer 115', covering the fill material 140 of the via structure 135, to form a thicker capping layer 115''' with respect to the capping layer 115. In embodiments, the thin capping (mask) material 115" is less than 5 nm, while the thickness of the thicker capping layer 115''' is in a range of about 5 nm to 15 nm thick. Specifically, the thicker capping layer 115''' will have a thickness which is about two to four times thicker than the thickness of the thin capping (mask) material 115". The use of the capping (mask) material 115" to form a thicker capper layer 115''' allows for the formation of a fully aligned skip via structure (partially formed with the via structure 135) and an improved alignment with the M2 metallization and subsequently formed via structures. Further, the thicker capping layer 115''' ensures appropriate minimum insulator spacing, even if there is any misalignment in the subsequent fully aligned skip via structure.

As should be understood by those of skill in the art, the minimum insulator is a minimum space between two neighboring lines, i.e., via structures. In embodiments, the minimum insulator needs to be above a certain tolerance in order to ensure the electric field between different conductors does not exceed a certain value. For example, the closer the conductors (via structures) come with respect to one another, the greater the likelihood of an instantaneous breakdown of the dielectric occurring. However, the formation of the thicker capping layer 115''', which comprises the thin capping material 115" and the capping layer 115', alleviates minimum insulator concerns by ensuring a proper gap fill 145 is provided between the metallization M2 and subsequently formed skip via structure.

Figure 4:
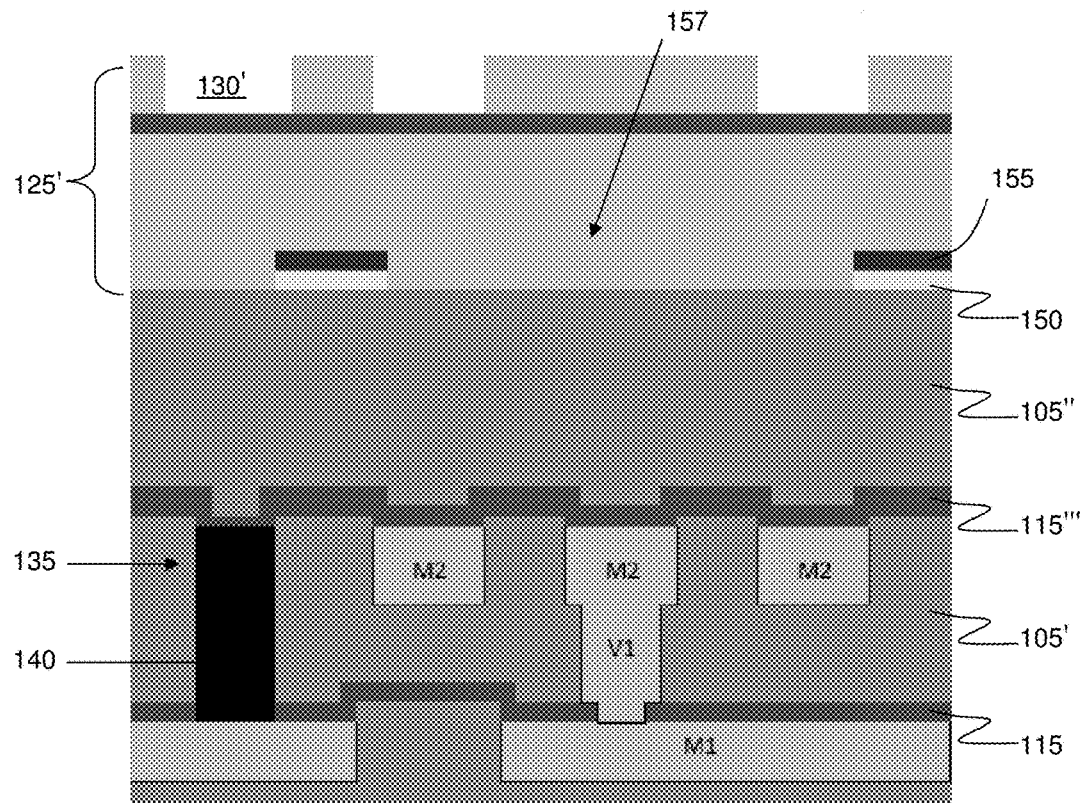
FIG. 4 shows an upper metallization layer, amongst other features, and respective fabrication processes in accordance with aspects of the present disclosure.

FIG. 4 shows a hardmask dual damascene process to form subsequent trenches and wiring structures. Specifically, a hardmask 150 and oxide (hardmask) layer 155 can be deposited on the uppermost ILD layer 105" by conventional deposition processes, e.g., CVD processes. The hardmask 150 can be a TiN material deposited by any conventional deposition processes, e.g., PVD processes. The hardmasks 150, 155 undergo a patterning process to form openings 157, exposing portions of the ILD layer 105". In embodiments, the edges of the hardmasks 150, 155 will align with selected metallization features M2. A lithographic stack 125' with openings 130' is formed over the hardmasks 150, 155, which will be used in dual damascene process to form, e.g., vias and trenches at least partially into ILD layer 105", with the vias landing on the M2 layer.

Figure 5:
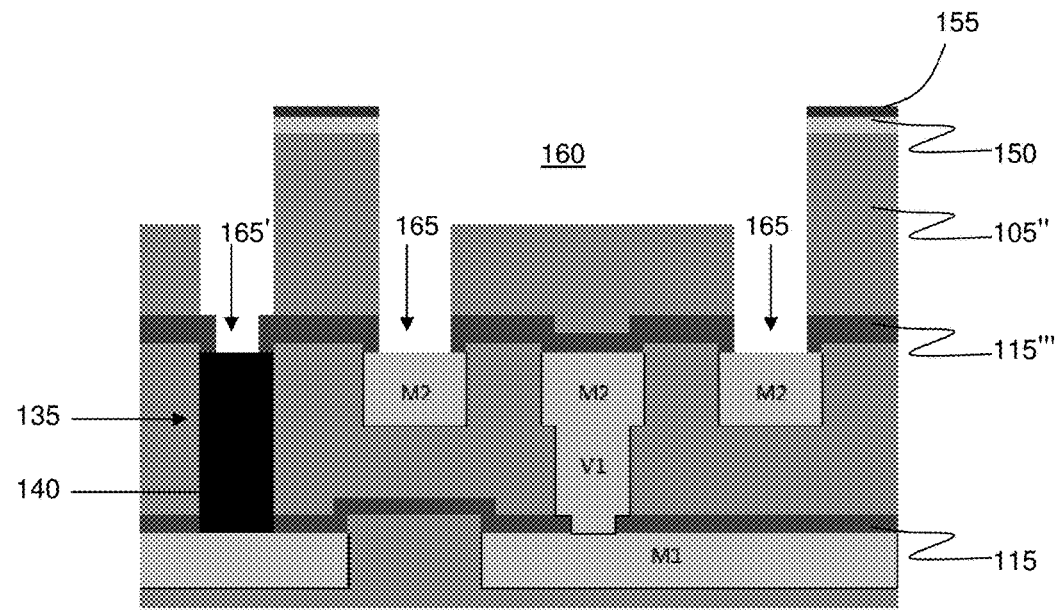
FIG. 5 shows trenches, amongst other features, and respective fabrication processes in accordance with aspects of the present disclosure.

FIG. 5 shows trenches 160 and via structures 165, 165' formed within the ILD layer 105" using the lithographic stack 125' and the hardmasks 150, 155 shown in FIG. 4. In embodiments, the via structures 165, 165' are formed by etching the ILD layer 105" through the openings 130' of the lithographic stack 125', which will land on the capping layer 115'''. The capping layer 115''' is then opened to expose the underlying metallization M2 and the (conductive) fill material 140, i.e., Co or Ru, of the via structure 135. This removal of the capping layer 115''' to expose the underlying materials 110' and 140 of the metallization M2 and the via structure 135, respectively, is provided simultaneously with the formation of the trench 160 in the ILD layer 105", through an etching process using the openings of the hardmasks. As should be understood by those of skill in the art, the via structure 165' exposing the fill material 140 will be subsequently filled to form a fully aligned skip via structure as described herein.

Figure 6:
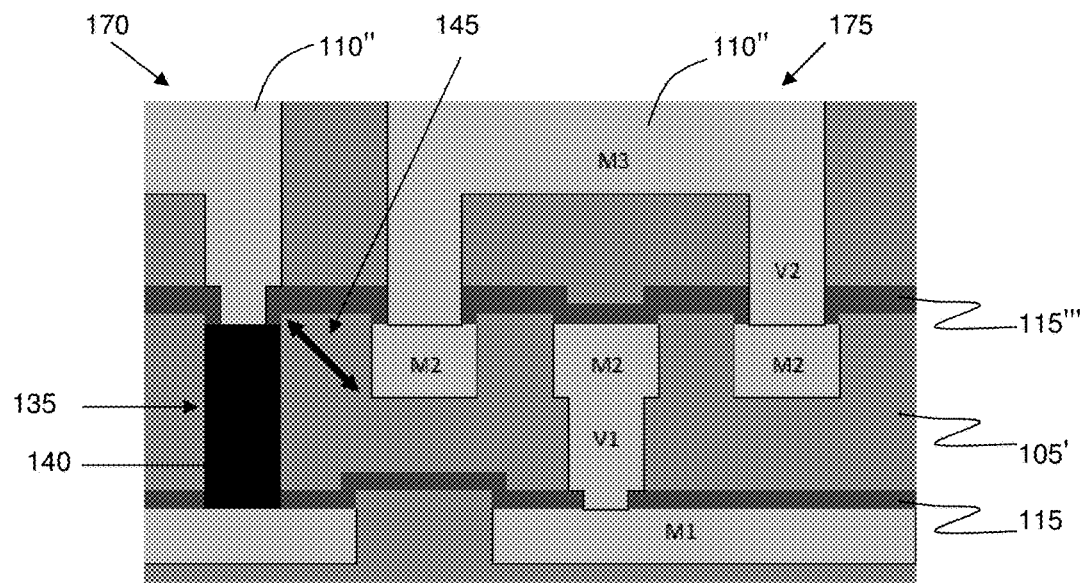
FIG. 6 shows a metal fill within the trenches, amongst other features, and respective fabrication processes in accordance with aspects of the present disclosure.

FIG. 6 shows a metallization in the vias and trenches of the ILD layer 105" with metal 110" to form both a self-aligned skip via structure 170 and metallization features 175, e.g., vias and wiring structures in electrical contact with the underlying metal materials 110' of the metallization M2. By being fully aligned, the skip via structure 170 has a minimum pitch, along with an improved profile control and gap fill 145, alleviating minimum insulator concerns. In embodiments, the metallization features 175 can be a metal or a metal alloy material 110" in direct electrical connection with the underlying materials 110' and 140 of the metallization M2 and the via structure 135. The metal materials 110" can be any conductive material such as, e.g., Cu, W or Al, amongst other examples, deposited using conventional deposition processes, e.g., CVD Cu processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a first metallization layer with a first capping layer over the first metallization layer;
    forming a second metallization layer with a second capping layer over the second metallization layer;
    etching through a first dielectric layer to the first capping layer;
    forming a partial skip via structure to the first metallization layer by removing a portion of the first capping layer and the second capping layer and depositing conductive material in an opening formed in the second metallization layer;
    forming a third capping layer over the filled partial skip via and directly on the second capping layer;
    forming a second dielectric layer covering select metallization features of the second metallization layer; and
    forming a remaining portion of a skip via structure in alignment with the partial skip via structure by opening the third capping layer to expose the conductive material of the partial skip via, wherein the third capping layer directly on the second capping layer forms a gap fill for the skip via structure.

2. The method of claim 1, wherein the partial skip via structure is partially filled by an electroless process.

3. The method of claim 2, wherein the electroless process comprises filling the partial skip via with Co or Ru.

4. The method of claim 1, wherein the partial skip via structure is filled with Co or Ru by a chemical vapor deposition process.

5. The method of claim 1, wherein the partial skip via structure is filled with the conductive material to about 80% to 90% of its height.

6. The method of claim 1, wherein the remaining portion of the skip via structure is filled with a metal selected from the group consisting of Co, W or Al.

7. The method of claim 1, further comprising forming a via to contact exposed metallization features of the second metallization layer in a same process as the remaining portion of the skip via structure.

8. The method of claim 7, wherein the via and the remaining portion of the skip via structure are filled with a different material than the partial skip via structure.

9. The method of claim 8, wherein the forming the remaining portion of the skip via structure is a self aligned process.

10. The method of claim 8, further comprising foi wing a wiring structure in contact with the via and the remaining portion of the skip via structure using a dual damascene process.

11. The method of claim 1, wherein the gap fill alleviates minimum insulator requirements.

12. The method of claim 11, wherein the minimum insulator requirements are a minimum spacing between via structures.

13. The method of claim 12, wherein the dielectric layer is a low-k dielectric material.

14. The method of claim 13, wherein the second metallization layer is an etched metallization layer.

15. The method of claim 14, wherein the etched metallization layer is etched using a wet process.

16. The method of claim 15, further comprising forming a third metallization layer simultaneously with the remaining portion of the skip via structure to contact metallization features of the second metallization feature layer.

* * * * *